(12) United States Patent
Iguchi et al.

(10) Patent No.: US 9,818,802 B2
(45) Date of Patent: Nov. 14, 2017

(54) ELECTROLUMINESCENT DEVICE COMPRISING CHANNELS, ITS MANUFACTURING METHOD, AND DISPLAY DEVICE

(71) Applicant: BOE TECHNOLOGY GROUP CO., LTD., Beijing (CN)

(72) Inventors: Shinsuke Iguchi, Beijing (CN); Chinlung Liao, Beijing (CN); Xue Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 222 days.

(21) Appl. No.: 14/770,957

(22) PCT Filed: Jan. 16, 2015

(86) PCT No.: PCT/CN2015/070848
§ 371 (c)(1),
(2) Date: Aug. 27, 2015

(87) PCT Pub. No.: WO2016/045268
PCT Pub. Date: Mar. 31, 2016

(65) Prior Publication Data
US 2016/0351632 A1   Dec. 1, 2016

(30) Foreign Application Priority Data
Sep. 22, 2014   (CN) .......................... 2014 1 0486549

(51) Int. Cl.
*H01L 27/32* (2006.01)
*H01L 51/00* (2006.01)
(Continued)

(52) U.S. Cl.
CPC ...... *H01L 27/3211* (2013.01); *H01L 27/3246* (2013.01); *H01L 27/3283* (2013.01);
(Continued)

(58) Field of Classification Search
CPC ............ H01L 27/3211; H01L 27/3246; H01L 51/0005; H01L 51/56
See application file for complete search history.

(56) References Cited

U.S. PATENT DOCUMENTS

2006/0084206 A1* 4/2006 Moriya ................ H05K 3/1258
438/149
2006/0188661 A1* 8/2006 Hirai ................... H01L 51/0005
427/533
(Continued)

FOREIGN PATENT DOCUMENTS

| CN | 1516528 A | 7/2004 |
|----|-----------|--------|
| CN | 101207150 A | 6/2008 |

(Continued)

OTHER PUBLICATIONS

English machine translation of CN103311269A of record.*
(Continued)

*Primary Examiner* — Tom Thomas
*Assistant Examiner* — Christopher M Roland
(74) *Attorney, Agent, or Firm* — Harness, Dickey & Pierce, P.L.C.

(57) ABSTRACT

The present disclosure provides an electroluminescent device, its manufacturing method, a display substrate and a display device. The electroluminescent device includes a substrate, and a pixel defining layer arranged on the substrate. A pixel aperture matrix is formed in the pixel defining layer, at least one connection channel is formed on the pixel defining layer, an electroluminescent layer in a predetermined color is formed in each pixel aperture of the pixel aperture matrix, and the connection channel is configured to connect at least two pixel apertures of the pixel aperture matrix in an identical row or column and corresponding to the electroluminescent layers in an identical color.

12 Claims, 6 Drawing Sheets

(51) Int. Cl.
　　　*H01L 21/77*　　　(2017.01)
　　　*H01L 51/50*　　　(2006.01)
　　　*H01L 51/56*　　　(2006.01)
(52) U.S. Cl.
　　　CPC .......... H01L 51/0005 (2013.01); *H01L 21/77* (2013.01); *H01L 51/5012* (2013.01); *H01L 51/56* (2013.01); *H01L 2227/323* (2013.01)

(56) References Cited

U.S. PATENT DOCUMENTS

| | | | |
|---|---|---|---|
| 2006/0284957 A1* | 12/2006 | Chou | G02B 5/201 347/107 |
| 2014/0061603 A1* | 3/2014 | Kim | H01L 51/5253 257/40 |
| 2014/0203303 A1 | 7/2014 | Jiang | |
| 2016/0043150 A1* | 2/2016 | Wang | H01L 27/3246 257/40 |

FOREIGN PATENT DOCUMENTS

| | | |
|---|---|---|
| CN | 202494843 U | 10/2012 |
| CN | 103187434 A | 7/2013 |
| CN | 103311269 A | 9/2013 |
| JP | 2000353594 A | 12/2000 |
| JP | 2002015866 A | 1/2002 |
| JP | 2004055177 A | 2/2004 |
| JP | 2007115529 A | 5/2007 |

OTHER PUBLICATIONS

First Office Action regarding Chinese application No. 201410486549.6, dated Sep. 5, 2016. Translation provided by Dragon Intellectual Property Law Firm.

Written Opinion of the International Searching Authority for international application No. PCT/CN2015/070848.

* cited by examiner

| forming a pixel defining layer on a substrate, a pixel aperture matrix being formed in the pixel defining layer, at least one connection channel being formed on the pixel defining layer, the connection channel being configured to connect at least two pixel apertures of the pixel aperture matrix in an identical row or column and corresponding to the electroluminescent layers in an identical color | — 101 |

| forming the electroluminescent layer in a predetermined color in each pixel aperture of the pixel aperture matrix | — 102 |

Fig.4

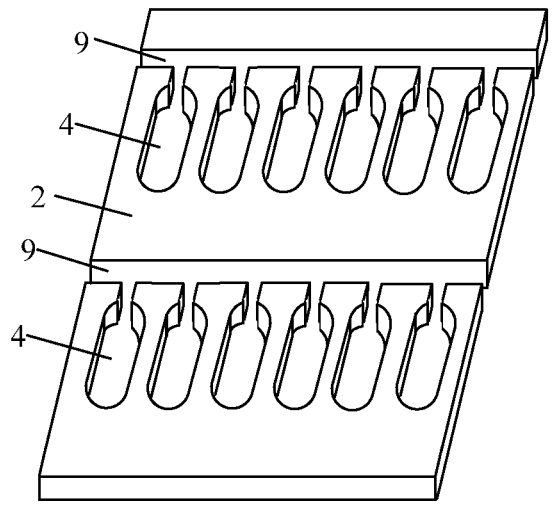

Fig.5a

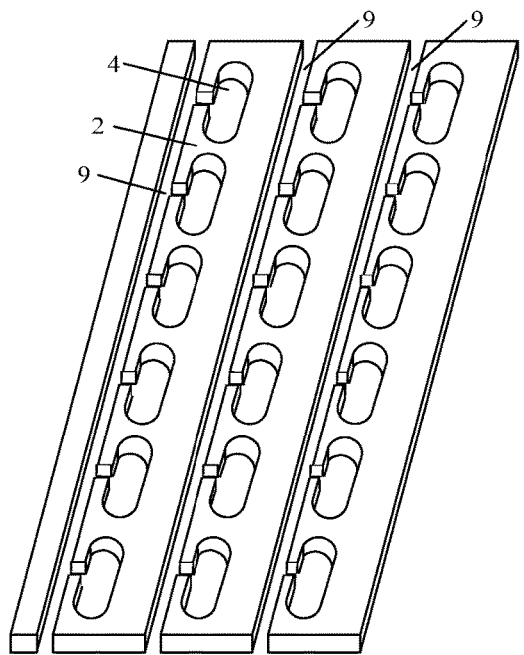

Fig.5b

| |
|---|
| forming a pixel defining layer on a substrate, a pixel aperture matrix being formed in the pixel defining layer, two horizontally-arranged connection channels being formed on the pixel defining layer and corresponding to a row of pixel apertures, the two horizontally-arranged connection channels being located at both sides of the corresponding row of the pixel apertures, respectively, one of the connection channels being configured to connect at least two pixel apertures in the corresponding row and corresponding to electroluminescent layers in a first color, and the other of the connection channels being configured to connect at least two pixel apertures in the corresponding row and corresponding to electroluminescent layers in a second color — 201 |
| subjecting the pixel defining layer and the connection channels to surface treatment, so as to enable an upper surface of the pixel defining layer to be lyophobic, and enable a bottom surface and/or an inner wall of the connection channel to be lyophilic — 202 |
| forming the electroluminescent layer in the first color in a first pixel aperture by ink-jetting — 203 |
| forming the electroluminescent layer in the second color in a second pixel aperture by ink-jetting — 204 |
| forming the electroluminescent layer in the third color in a third pixel aperture by evaporation — 205 |

ELECTROLUMINESCENT DEVICE COMPRISING CHANNELS, ITS MANUFACTURING METHOD, AND DISPLAY DEVICE

CROSS-REFERENCE TO RELATED APPLICATION

The present application is the U.S. national phase of PCT Application No. PCT/CN2015/070848 filed on Jan. 16, 2015, which claims a priority of the Chinese patent application No. 201410486549.6 filed on Sep. 22, 2014, which is incorporated herein by reference in its entirety.

TECHNICAL FIELD

The present disclosure relates to the field of display technology, in particular to an electroluminescent device, its manufacturing method, a display substrate and a display device.

BACKGROUND

Recently, in the field of electroluminescence, when an electroluminescent material is coated by ink-jetting, it is required to form a pixel defining layer in an electroluminescent device so as to define a coating region and prevent a solution of the electroluminescent material from flowing into an adjacent pixel.

As shown in FIG. 1 which is a sectional view of an existing electroluminescent device, FIG. 2 which is a top view of the existing electroluminescent device and FIG. 3 which is a schematic view showing an existing pixel defining layer, the electroluminescent device includes a substrate 1 and a pixel defining layer 2 arranged on the substrate 1. A pixel aperture matrix is formed in the pixel defining layer 2 and corresponds to a pixel unit matrix, i.e., each pixel unit 8 corresponds to a pixel aperture 4. An electroluminescent layer 3 in a predetermined color is formed in the pixel aperture 4. For example, an electroluminescent layer 7 in red is formed in the pixel aperture 4 corresponding to a red pixel unit, an electroluminescent layer 6 in green is formed in the pixel aperture 4 corresponding to a green pixel unit, and an electroluminescent layer 5 in blue is formed in the pixel aperture 4 corresponding to a blue pixel unit.

A procedure of forming the electroluminescent layer by ink-jetting will be described hereinafter by taking the electroluminescent layer 7 in red formed in the pixel aperture 4 corresponding to the red pixel unit as an example. At first, a solution of a red electroluminescent material is dripped by two (or more) nozzles of an inkjet device into the pixel aperture at a corresponding position, and after the dripping, the solution of red the electroluminescent material is dried by a drying device so as to form the electroluminescent layer 7 in red.

However, during the dripping of the solution of the red electroluminescent material, due to the possible difference in the amounts of the solution dripped by different nozzles, the amounts of the solution of the red electroluminescent material in different pixel apertures may be different from each other. As a result, the electroluminescent layers 7 in red formed after the drying process will have different thicknesses, i.e., the entire electroluminescent layer 7 in red in the electroluminescent device is of an uneven thickness.

In the related art, when the electroluminescent layers in an identical color in the electroluminescent device are of different thicknesses, uneven light beams may be generated by the electroluminescent device. As a result, such a phenomenon as Mura will occur and the performance of the electroluminescent device will be affected adversely.

SUMMARY

An object of the present disclosure is to provide an electroluminescent device, its manufacturing method, a display substrate and a display device, so as to provide electroluminescent layers in an identical color with an identical thickness.

In one aspect, the present disclosure provides in one embodiment an electroluminescent device, including a substrate, and a pixel defining layer arranged on the substrate. A pixel aperture matrix is formed in the pixel defining layer, at least one connection channel is formed on the pixel defining layer, an electroluminescent layer in a predetermined color is formed in each pixel aperture of the pixel aperture matrix, and the connection channel is configured to connect at least two pixel apertures of the pixel aperture matrix in an identical row or column and corresponding to the electroluminescent layers in an identical color.

Alternatively, the connection channel is arranged horizontally or longitudinally, the horizontally-arranged connection channel is configured to connect all the pixel apertures of the pixel aperture matrix in an identical row and corresponding to the electroluminescent layers in an identical color, and the longitudinally-arranged connection channel is configured to connect all the pixel apertures of the pixel aperture matrix in an identical column and corresponding to the electroluminescent layers in an identical color.

Alternatively, all the connection channels on the pixel defining layer are arranged horizontally, or longitudinally.

Alternatively, when all the connection channels are arranged horizontally, the pixel apertures in one row correspond to a horizontally-arranged connection channel which is located at a side of the corresponding row of the pixel apertures; and when all the connection channels are arranged longitudinally, the pixel apertures in one column correspond to a longitudinally-arranged connection channel which is located at a side of the corresponding column of the pixel apertures.

Alternatively, when all the connection channels are arranged horizontally, the pixel apertures in one row correspond to two horizontally-arranged connection channels which are arranged at both sides of the corresponding row of the pixel apertures, respectively; and when all the connection channels are arranged longitudinally, the pixel apertures in one column correspond to two longitudinally-arranged connection channels which are arranged at both sides of the corresponding column of the pixel apertures, respectively.

Alternatively, the predetermined colors include a first color, a second color and a third color, and the pixel aperture matrix includes a first pixel aperture corresponding to the electroluminescent layer in the first color, a second pixel aperture corresponding to the electroluminescent layer in the second color and a third pixel aperture corresponding to the electroluminescent layer in the third color. When all the connection channels are arranged horizontally, the connection channel located at one side of a row of the pixel apertures is connected to the first pixel apertures in the corresponding row, and the connection channel located at the other side of the row of the pixel apertures is connected to the second pixel apertures in the corresponding row. When all the connection channels are arranged longitudinally, the connection channel located at one side of a column of the pixel apertures is connected to the first pixel apertures in the corresponding column, and the connection channel located at the other side of the column of the pixel apertures is connected to the second pixel apertures in the corresponding column.

In another aspect, the present disclosure provides in one embodiment a method for manufacturing an electroluminescent device, including steps of: forming a pixel defining layer on the substrate, a pixel aperture matrix being formed in the pixel defining layer, at least one connection channel being formed on the pixel defining layer, the connection channel being configured to connect at least two pixel apertures of the pixel aperture matrix in an identical row or column and corresponding to the electroluminescent layers in an identical color; and forming the electroluminescent layer in a predetermined color in each pixel aperture of the pixel aperture matrix.

Alternatively, the step of forming the pixel defining layer on the substrate includes: forming a base material of the pixel defining layer on the substrate; and patterning the base material of the pixel defining layer so as to form the pixel aperture matrix and the connection channel.

Alternatively, the connection channel is arranged horizontally or longitudinally, the horizontally-arranged connection channel is configured to connect all the pixel apertures of the pixel aperture matrix in an identical row and corresponding to the electroluminescent layers in an identical color, and the longitudinally-arranged connection channel is configured to connect all the pixel apertures of the pixel aperture matrix in an identical column and corresponding to the electroluminescent layers in an identical color.

Alternatively, all the connection channels on the pixel defining layer are arranged horizontally, or longitudinally.

Alternatively, when all the connection channels are arranged horizontally, the pixel apertures in one row correspond to a horizontally-arranged connection channel which is located at a side of the corresponding row of the pixel apertures; and when all the connection channels are arranged longitudinally, the pixel apertures in one column correspond to a longitudinally-arranged connection channel which is located at a side of the corresponding column of the pixel apertures.

Alternatively, when all the connection channels are arranged horizontally, the pixel apertures in one row correspond to two horizontally-arranged connection channels which are arranged at both sides of the corresponding row of the pixel apertures, respectively; and when all the connection channels are arranged longitudinally, the pixel apertures in one column correspond to two longitudinally-arranged connection channels which are arranged at both sides of the corresponding column of the pixel apertures, respectively.

Alternatively, the predetermined colors include a first color, a second color and a third color, and the pixel aperture matrix includes a first pixel aperture corresponding to the electroluminescent layer in the first color, a second pixel aperture corresponding to the electroluminescent layer in the second color and a third pixel aperture corresponding to the electroluminescent layer in the third color. When all the connection channels are arranged horizontally, the connection channel located at one side of a row of the pixel apertures is connected to the first pixel apertures in the corresponding row, and the connection channel located at the other side of the row of the pixel apertures is connected to the second pixel apertures in the corresponding row. When all the connection channels are arranged longitudinally, the connection channel located at one side of a column of the pixel apertures is connected to the first pixel apertures in the corresponding column, and the connection channel located at the other side of the column of the pixel apertures is connected to the second pixel apertures in the corresponding column.

Alternatively, the step of forming the electroluminescent layer in a predetermined color in each pixel aperture of the pixel aperture matrix includes: forming the electroluminescent layer in the first color and the electroluminescent layer in the second color in the first pixel aperture and the second pixel aperture by ink-jetting, respectively; and forming the electroluminescent layer in the third color in the third pixel aperture by evaporation.

Alternatively, the step of forming the electroluminescent layer in the first color and the electroluminescent layer in the second color in the first pixel aperture and the second pixel aperture by ink-jetting, respectively, includes: dripping a solution of an electroluminescent material in the first color and a solution of an electroluminescent material in the second color into the first pixel aperture and the second pixel aperture in a longitudinal direction, respectively; and drying the solution of the electroluminescent material in the first color and the solution of the electroluminescent material in the second color, so as to form the electroluminescent layer in the first color and the electroluminescent layer in the second color, respectively.

Alternatively, when all the connection channels are arranged horizontally, the step of forming the electroluminescent layer in the first color and the electroluminescent layer in the second color in the first pixel aperture and the second pixel aperture by ink-jetting, respectively, includes: dripping a solution of an electroluminescent material in the first color and a solution of an electroluminescent material in the second color into the connection channel connected to the first pixel aperture and the connection channel connected to the second pixel aperture in a horizontal direction, respectively, the solution of the electroluminescent material in the first color flowing into the first pixel aperture along the connection channel, and the solution of the electroluminescent material in the second color flowing into the second pixel aperture along the connection channel; and drying the solution of the electroluminescent material in the first color and the solution of the electroluminescent material in the second color, so as to form the electroluminescent layer in the first color and the electroluminescent layer in the second color, respectively.

When all the connection channels are arranged longitudinally, the step of forming the electroluminescent layer in the first color and the electroluminescent layer in the second color in the first pixel aperture and the second pixel aperture by ink-jetting, respectively, includes: dripping a solution of an electroluminescent material in the first color and a solution of an electroluminescent material in the second color into the connection channel connected to the first pixel aperture and the connection channel connected to the second pixel aperture in a longitudinal direction, respectively, the solution of the electroluminescent material in the first color flowing into the first pixel aperture along the connection channel, and the solution of the electroluminescent material in the second color flowing into the second pixel aperture along the connection channel; and drying the solution of the electroluminescent material in the first color and the solution of the electroluminescent material in the second color, so as to form the electroluminescent layer in the first color and the electroluminescent layer in the second color, respectively.

Alternatively, prior to the step of forming the electroluminescent layer in the predetermined color in each pixel aperture of the pixel aperture matrix, the method further includes: subjecting the pixel defining layer and the connection channel to surface treatment, so as to enable an upper surface of the pixel defining layer to be lyophobic, and enable a bottom surface and/or an inner wall of the connection channel to be lyophilic.

Alternatively, the pixel defining layer is made of polyimide, and the step of subjecting the pixel defining layer and the connection channel to surface treatment includes: subjecting the upper surface of the pixel defining layer and the bottom surface and/or the inner wall of the connection channel to plasma treatment; and irradiating the bottom surface and/or the inner wall of the connection channel with ultraviolet light.

Alternatively, a reactive gas for the plasma treatment is fluoride.

In yet another aspect, the present disclosure provides in one embodiment a display substrate including the above-mentioned electroluminescent device.

In still yet another aspect, the present disclosure provides in one embodiment a display device including the above-mentioned display substrate.

According to the electroluminescent device, its manufacturing method, the display substrate and the display device, the connection channel is formed on the pixel defining layer and configured to connect the pixel apertures in an identical row or column and corresponding to the electroluminescent layers in an identical color. When the solution of the electroluminescent material is dripped into the pixel aperture, the amounts out the solution of the electroluminescent material in the pixel apertures in an identical row or column and corresponding to the electroluminescent layers in an identical color are the same, and the electroluminescent layers formed after the drying are of an identical thickness. As a result, it is able to enable the electroluminescent device to emit light in an even manner, thereby to improve the performance of the electroluminescent device.

BRIEF DESCRIPTION OF THE DRAWINGS

FIG. 4 is a flow chart of a method for manufacturing an electroluminescent device according to the first embodiment of the present disclosure;

FIG. 5a is a schematic view showing a pixel defining layer according to the first embodiment of the present disclosure;

FIG. 5b is another schematic view showing the pixel defining layer according to the first embodiment of the present disclosure;

FIG. 6 is another flow chart of the method for manufacturing the electroluminescent device according to the second embodiment of the present disclosure;

DETAILED DESCRIPTION

Figure 1:
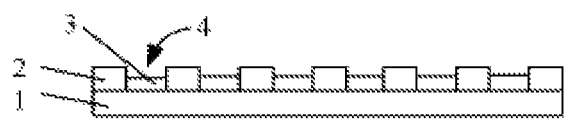
FIG. 1 is a sectional view of an existing electroluminescent device.
Figure 2:
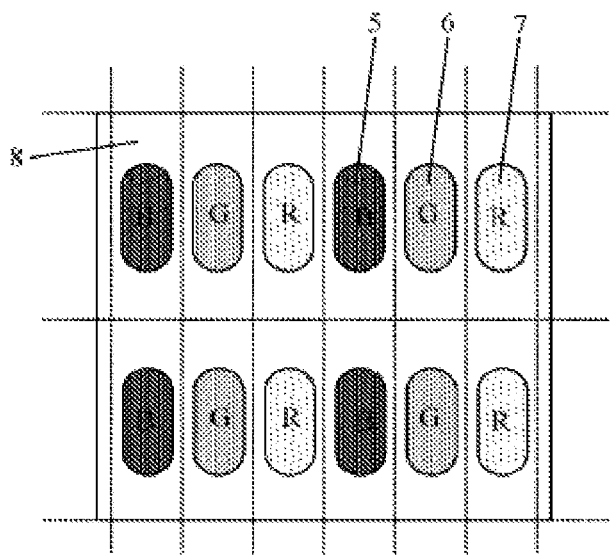
FIG. 2 is a top view of the existing electroluminescent device.
Figure 3:
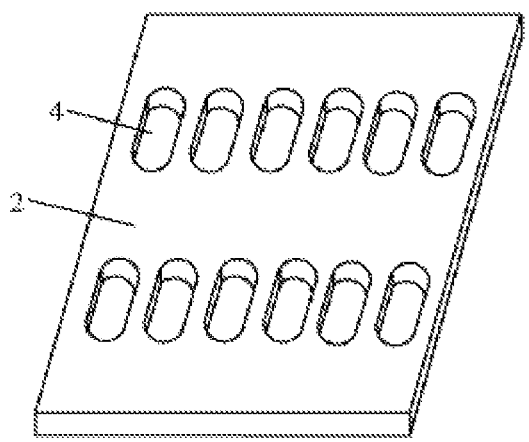
FIG. 3 is a schematic view showing an existing pixel defining layer.

For ease of understanding, the present disclosure will be described hereinafter in conjunction with the drawings and embodiments.

First Embodiment

As shown in FIG. 4, which is a flow chart of a method for manufacturing an electroluminescent device according to the first embodiment of the present disclosure, the method includes the following steps.

Step 101: forming a pixel defining layer on the substrate, a pixel aperture matrix being formed in the pixel defining layer, at least one connection channel being formed on the pixel defining layer, the connection channel being configured to connect at least two pixel apertures of the pixel aperture matrix in an identical row or column and corresponding to the electroluminescent layers in an identical color.

Alternatively, Step 101 includes: Step 1011 of forming a base material of the pixel defining layer on the substrate; and Step 1012 of patterning the base material of the pixel defining layer so as to form the pixel aperture matrix and the connection channel.

As shown in FIG. 5a, which is a schematic view showing the pixel defining layer according to the first embodiment of the present disclosure, the base material of the pixel defining layer is an insulating material, e.g., polyimide. At Step 101, a polyimide layer having a thickness of 1 to 10 μm is formed on the substrate (not shown) by a coating process, and then patterned so as to form the pixel aperture matrix and the connection channel 9. The pixel aperture matrix includes a plurality of pixel apertures 4. A region where the pixel apertures 4 are located corresponds to a display region of the electroluminescent device, and a region covered with the pixel defining layer 2 corresponds to a non-display region of the electroluminescent device. The formed connection channel is configured to connect at least two pixel apertures of the pixel aperture matrix in an identical row or column and corresponding to the electroluminescent layers in an identical color.

It should be appreciated that, the substrate may be a base substrate or an array substrate, and the patterning process may at least include processes of coating, exposing, developing, etching and removing a photoresist. In addition, the step of forming the pixel aperture matrix and the connection channel 9 may be completed by a single patterning process.

FIG. 5a merely shows a situation where the connection channel 9 is arranged horizontally, and the horizontally-arranged connection channel 9 is configured to connect all the pixel apertures 4 in an identical row and corresponding to the electroluminescent layers in an identical color. In addition, all the connection channels 9 are horizontally arranged on the pixel defining layer in FIG. 5a.

It should be further appreciated that, the electroluminescent layers in an identical color refer to the electroluminescent layers made of an identical material and capable of generating light beams in an identical color. Subsequent to Step 101, it is required to form the electroluminescent layers in at least one color in the pixel apertures of the pixel aperture matrix. When all the pixel apertures 4 in an identical row correspond to the electroluminescent layers in an identical color, the horizontally-arranged connection channel 9 may be formed at one side of the corresponding row of the pixel apertures 4. This connection channel 9 is connected to all the pixel apertures in the corresponding row, i.e., one row of pixel apertures 4 corresponds to one connection channel 9, as shown in FIG. 5*a*.

FIG. 5*b* shows a situation where the connection channel 9 is arranged longitudinally, and the longitudinally-arranged connection channel 9 connects the pixel apertures 4 in an identical column and corresponding to the electroluminescent layers in an identical color. In addition, when all the pixel apertures 4 in an identical column correspond to the electroluminescent layers in an identical color, the longitudinally-arranged connection channel 9 may be formed at one side of the corresponding row of the pixel apertures 4.

Step 102: forming the electroluminescent layer in a predetermined color in each pixel aperture of the pixel aperture matrix.

Step 102 will be described hereinafter when a solution of an electroluminescent material is dripped into the pixel aperture in the pixel defining layer as shown in FIG. 5*a*.

At Step 102, a solution of an electroluminescent material in a predetermined color is dripped into the pixel apertures 4 by an ink-jetting device, and then the solution of the electroluminescent material is dried by a drying device so as to form the electroluminescent layers.

To be specific, when the solution of the electroluminescent material is dripped into the pixel apertures 4, the pixel apertures 4 corresponding to an identical color in a row of pixel apertures are connected to the horizontally-arranged connection channel 9, so the solution of the electroluminescent material in the pixel apertures connected to the horizontally-arranged connection channel 9 may flow into the horizontally-arranged connection channel 9, and meanwhile the solution of the electroluminescent material in the horizontally-arranged connection channel 9 may flow into the pixel apertures 4 too. When an excessive amount of the solution of the electroluminescent material is dripped into one or more pixel apertures 4, a liquid level of the solution in the pixel apertures 4 may be elevated, and at this time, the solution in these pixel apertures 4 may flow to the pixel apertures 4 into which an insufficient amount of the solution of the electroluminescent material is dripped through the horizontally-arranged connection channel 9, so as to ensure the solution in the pixel aperture 4 in an identical row and corresponding to the electroluminescent layers in an identical color to be at an identical liquid level, i.e., to provide the solution in the pixel apertures 4 at an identical amount. Hence, after the drying, the electroluminescent layers in the pixel apertures 4 in an identical row and corresponding to the electroluminescent layers in an identical color may be of an identical thickness. As a result, it is able to ensure the light-emitting evenness of the electroluminescent device, thereby to improve the performance thereof.

It should be appreciated that, a procedure of dripping the solution of the electroluminescent material into the pixel apertures 4 in the pixel defining layer in FIG. 5*b* is similar to that mentioned above, and thus will not be repeated herein.

In addition, no matter whether the connection channel 9 is arranged horizontally or longitudinally, the connection channel 9 may not cause an adverse effect on the display of the electroluminescent device because the connection channel 9 is arranged at the non-display region of the electroluminescent device.

According to the method in the first embodiment of the present disclosure, the connection channel is formed on the pixel defining layer and configured to connect the pixel apertures in an identical row or column and corresponding to the electroluminescent layers in an identical color. When the solution of the electroluminescent material is dripped into the pixel aperture, the amounts of the solution of the electroluminescent material in the pixel apertures in an identical row or column and corresponding to the electroluminescent layers in an identical color are the same, and the electroluminescent layers formed after the drying are of an identical thickness. As a result, it is able to enable the electroluminescent device to emit light in an even manner, thereby to improve the performance of the electroluminescent device.

Second Embodiment

On the basis of the first embodiment, when the electroluminescent layers in two colors are formed in the pixel apertures 4 in an identical row, two horizontally-arranged connection channels 9 may be formed at both sides of the corresponding row of the pixel apertures 4, respectively. One of the connection channels 9 is connected to the pixel apertures 4 corresponding to one color, and the other of the connection channels 9 is connected to the pixel apertures 4 corresponding to the other color. In other words, one row of pixel apertures 4 corresponds to two connection channels 9.

When the electroluminescent layers in more than two colors are formed in the pixel apertures 4 in an identical row, at most two connection channels 9 are formed at both sides of the corresponding row of the pixel apertures 4, respectively. The two connection channels 9 are connected to the pixel apertures 4 in which the electroluminescent layers in two colors are formed, and the remaining pixel apertures 4 in the corresponding row are not connected to the connection channels 9.

The electroluminescent device manufactured in this embodiment belongs to the latter. It includes the electroluminescent layers in three colors, i.e., the predetermined colors include a first color, a second color and a third color.

As shown in FIG. 6, which is another flow chart of the method for manufacturing the electroluminescent device according to the second embodiment of the present disclosure, the method includes the following steps.

Step 201: forming the pixel defining layer on the substrate, the pixel aperture matrix being formed in the pixel defining layer, two horizontally-arranged connection channels being formed on the pixel defining layer and corresponding to a row of pixel apertures, the two horizontally-arranged connection channels being located at both sides of the corresponding row of the pixel apertures, respectively, one of the connection channels being configured to connect at least two pixel apertures in the same row and corresponding to the electroluminescent layers in the first color, and the other of the connection channels being configured to connect at least two pixel apertures in the same row and corresponding to the electroluminescent layers in the second color.

Figure 7:
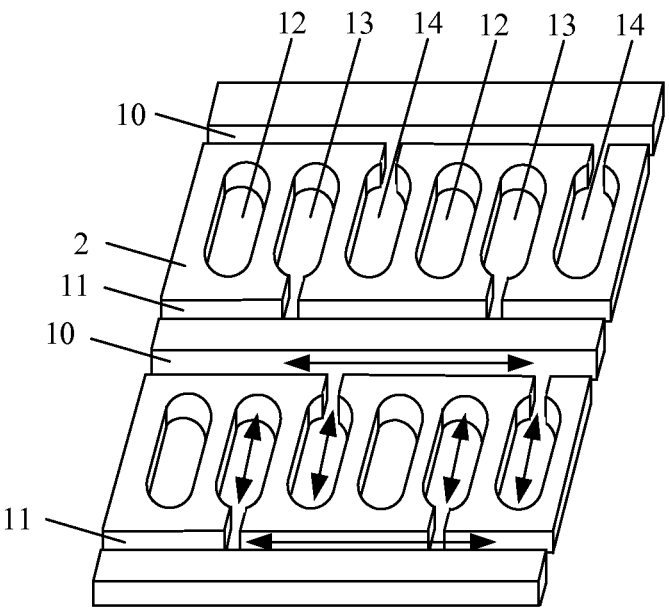
FIG. 7 is a schematic view showing the pixel defining layer according to the second embodiment of the present disclosure.

As shown in FIG. 7, which is a schematic view showing the pixel defining layer according to the second embodiment of the present disclosure, the pixel defining layer 2 is made of an insulating layer, e.g., polyimide. At Step 201, a polyimide layer having a thickness of 1 to 10 μm is formed on the substrate by a coating process, and then patterned so as to form the pixel aperture matrix and the connection channels 9. The pixel aperture matrix includes a first pixel aperture 14 corresponding to the electroluminescent layer in the first color, a second pixel aperture 13 corresponding to the electroluminescent layer in the second color and a third pixel aperture 12 corresponding to the electroluminescent layer in the third color.

In FIG. 7, one row of pixel apertures corresponds to two horizontally-arranged connection channels 10, 11, which are located at both sides of the corresponding row of the pixel apertures, respectively. The connection channel 10 located at an upper side of the corresponding row of the pixel apertures is connected to the first pixel apertures 14 in the corresponding row, the connection channel 11 located at a lower side of the corresponding row of the pixel apertures is connected to the second pixel apertures 13 in the corresponding row, and the third pixel apertures 12 in the corresponding row are not connected to the connection channels.

Step 202: subjecting the pixel defining layer and the connection channels to surface treatment, so as to enable an upper surface of the pixel defining layer to be lyophobic, and enable a bottom surface and/or an inner wall of the connection channel to be lyophilic.

Alternatively, Step 202 includes: Step 2021 of subjecting the upper surface of the pixel defining layer to lyophobization treatment; and Step 2022 of subjecting the bottom surface and/or the inner wall of the connection channel to lyophilization treatment.

At Steps 2021 and 2022, the pixel defining layer 2 is subjected to lyophobization treatment at first. To be specific, the pixel defining layer 2 is subjected to plasma treatment at a normal reactive pressure and using fluoride (e.g., carbon tetrafluoride) as a reactive gas, so as to enable the upper surface of the pixel defining layer 2, inner walls of the pixel apertures (the first pixel aperture 14, the second pixel aperture 13 and the third pixel aperture 12), and the bottom surfaces and the inner walls of the connection channels 10, 11 to be lyophobic. Then, the bottom surfaces and/or the inner walls of the connection channels 10, 11 are irradiated with ultraviolet light, so as to reduce the lyophobicity of the bottom surfaces and/or the inner walls of the connection channels 10, 11, thereby to enable them to be lyophilic. At this time, the upper surface of the pixel defining layer 2 is still lyophobic.

Due to the lyophobicity of the upper surface of the pixel defining layer 2, it is able to prevent the overflow of the solution of the electroluminescent material when it is dripped into the pixel apertures subsequently. Meanwhile, due to the lyophilicity of the bottom surfaces and/or the inner walls of the connection channels 10, 11, it is able to facilitate the flow of the solution of the electroluminescent material in the connection channels.

Step 203: forming the electroluminescent layer in the first color in the first pixel aperture by ink-jetting.

Alternatively, Step 203 includes the following steps.

Step 2031: dripping the solution of the electroluminescent material in the first color into the first pixel aperture in a longitudinal direction. At this step, a nozzle of the ink-jetting device is arranged above the first pixel aperture 14. During the dripping, the nozzle moves in the longitudinal direction (i.e., a direction indicated by an arrow in the first pixel aperture 14 in FIG. 7), so as to evenly drip the solution of the electroluminescent material in the first color into the first pixel aperture 14. When an excessive amount of the solution of the electroluminescent material in the first color is dripped into one or more first pixel apertures 14 in an identical row, the solution of the electroluminescent material in the first color may flow to the other first pixel apertures 14 into which an insufficient amount of the solution of the electroluminescent material is dripped through the horizontally-arranged connection channel 10, so as to enable the solution in all the first pixel apertures 14 in an identical row to be at an identical liquid level, i.e., to enable the solution in all the first pixel apertures 14 in an identical row to be at an identical amount.

Step 2032: drying the solution of the electroluminescent material in the first color in the first pixel aperture, so as to form the electroluminescent layer in the first color. At this step, the solution of the electroluminescent material in the first color in the first pixel aperture 14 is dried to form the electroluminescent layer in the first color, and all the electroluminescent layers in the first color in an identical row are of an identical thickness.

It should be appreciated that, in his embodiment, when a width of the horizontally-arranged connection channel 10 is of a predetermined value, the solution of the electroluminescent material in the first color may be dripped into the horizontally-arranged connection channel 10 connected to the first pixel aperture 14 in the horizontal direction (i.e., a direction indicated by an arrow in the connection channel 10 in FIG. 7), and the solution of the electroluminescent material in the first color flows into the first pixel apertures 14 in the corresponding row along the horizontally-arranged connection channel 10. Then, the solution of the electroluminescent material in the first color within the first pixel apertures 14 is dried so as to form the electroluminescent layers in the first color. Through the above steps, it is also able to ensure that the electroluminescent layers in the first color within each first pixel apertures 14 in an identical row have an identical thickness.

Step 204: forming the electroluminescent layer in the second color in the second pixel aperture by ink-jetting. This step is similar to Step 203.

It should be appreciated that, Steps 203 and 204 may be performed simultaneously, i.e., the solution of the electroluminescent material in the second color may be dripped into the second pixel aperture 13 while dripping the solution of the electroluminescent material in the first color into the first pixel aperture 14, and then the solution of the electroluminescent material in the first color and the solution of the electroluminescent material in the second color may be dried simultaneously so as to form the electroluminescent layer in the first color and the electroluminescent layer in the second color.

Step 205: forming the electroluminescent layer in the third color in the third pixel aperture by evaporation. At Step 205, the electroluminescent layer in the third color is deposited into the third pixel aperture 12 by an evaporation device. This evaporation procedure is known in the art, and thus will not be particularly defined herein. When the electroluminescent layers in the third color are formed by evaporation, it is able to accurately control a thickness of each electroluminescent layer in the third color, thereby to ensure that the electroluminescent layers in the third color in all the third pixel apertures 12 have an identical thickness.

It should be appreciated that, an order of Steps 203, 204 and 205 is not particularly defined in this embodiment.

Figure 8:
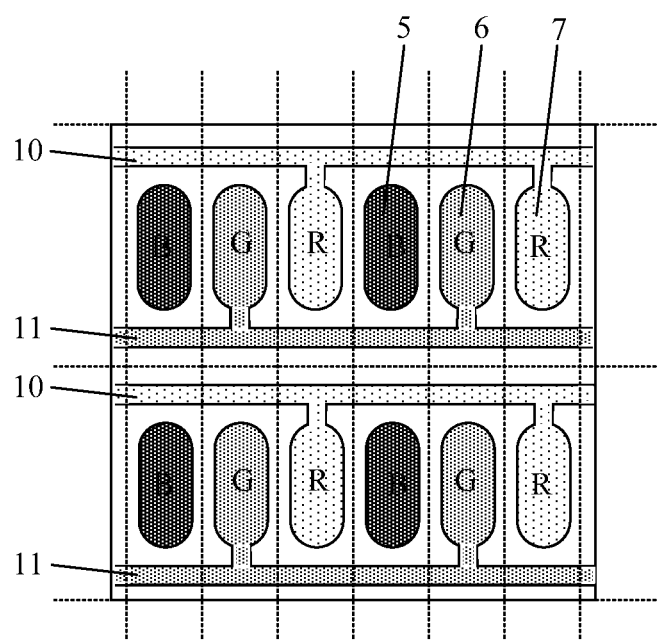
FIG. 8 is a schematic view showing electroluminescent layers formed in a pixel aperture matrix according to one embodiment of the present disclosure.

FIG. 8 is a schematic view showing the electroluminescent layers formed in the pixel aperture matrix. As a practical design, the first color is red, the second color is green and the third color is blue. In other words, an electroluminescent layer 7 in red is formed in the first pixel aperture 14, an electroluminescent layer 6 in green is formed in the second pixel aperture 13, and an electroluminescent layer 5 in blue is formed in the third pixel aperture 12. The first connection channel 10 is located at an upper side of the corresponding row of the pixel apertures and connected to all the first pixel apertures 14 in the corresponding row. The second connection channel 11 is located at a lower side of the corresponding row of the pixel apertures and connected to all the second pixel apertures 13 in the corresponding row. The electroluminescent layers in red and green are formed by ink-jetting, and the electroluminescent layer in blue is formed by evaporation.

According to the method in the second embodiment of the present disclosure, the connection channel is formed on the pixel defining layer and configured to connect the pixel apertures in an identical row or column and corresponding to the electroluminescent layers in an identical color. When the solution of the electroluminescent material is dripped into the pixel aperture, the amounts of the solution of the electroluminescent material in the pixel apertures in an identical row or column and corresponding to the electroluminescent layers in an identical color are the same, and the electroluminescent layers formed after the drying are of an identical thickness. As a result, it is able to enable the electroluminescent device to emit light in an even manner, thereby to improve the performance of the electroluminescent device.

Third Embodiment

On the basis of the first embodiment, when the electroluminescent layers in two or more colors are formed in the pixel apertures 4 in an identical column, the longitudinally-arranged connection channels 9 may be formed at both sides of the corresponding column of the pixel apertures 4, respectively.

The electroluminescent device obtained in this embodiment includes the electroluminescent layers in three colors, i.e., the predetermined colors include a first color, a second color and a third color.

Figure 9:
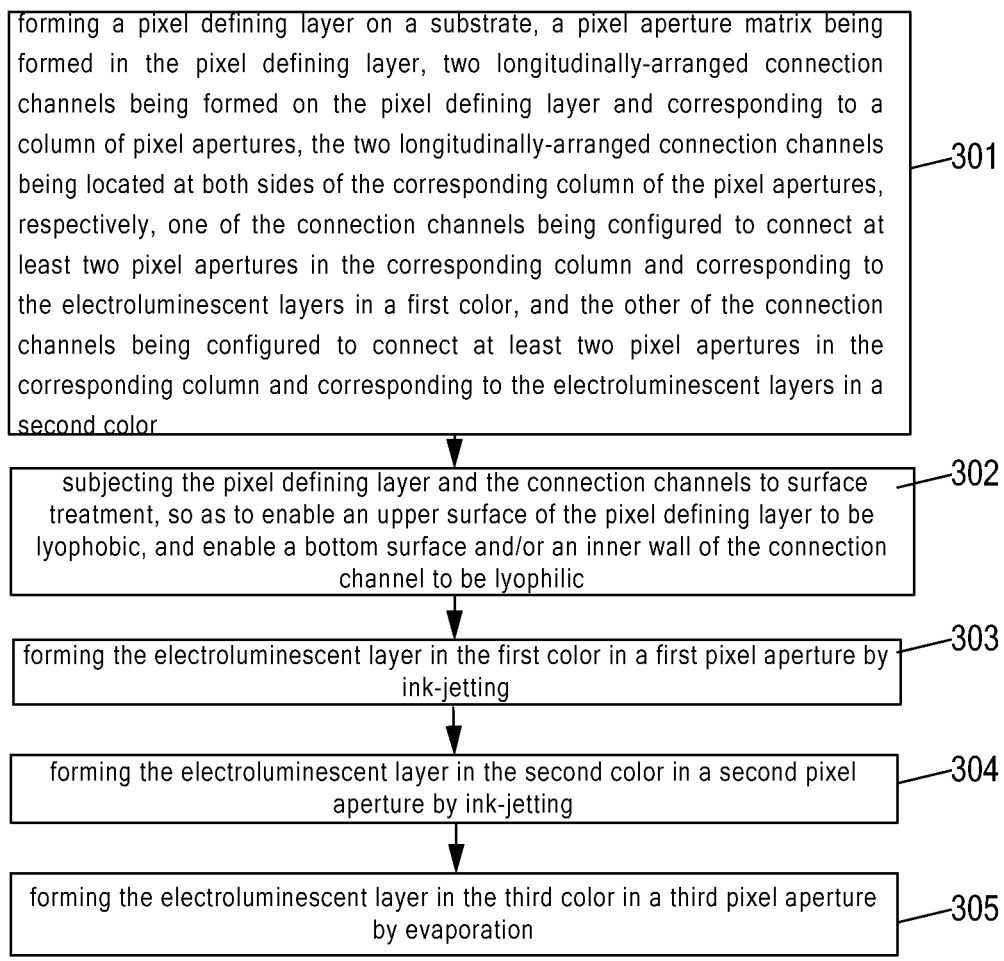
FIG. 9 is yet another flow chart of the method for manufacturing the electroluminescent device according to the third embodiment of the present disclosure.

As shown in FIG. 9, which is yet another flow chart of the method for manufacturing the electroluminescent device according to the third embodiment of the present disclosure, the method includes the following steps.

Step 301: forming the pixel defining layer on the substrate, the pixel aperture matrix being formed in the pixel defining layer, two longitudinally-arranged connection channels being formed on the pixel defining layer and corresponding to a column of pixel apertures, the two longitudinally-arranged connection channels being located at both sides of the corresponding column of the pixel apertures, respectively, one of the connection channels being configured to connect at least two pixel apertures in the corresponding column and corresponding to the electroluminescent layers in the first color, and the other of the connection channels being configured to connect at least two pixel apertures in the corresponding column and corresponding to the electroluminescent layers in the second color.

Figure 10:
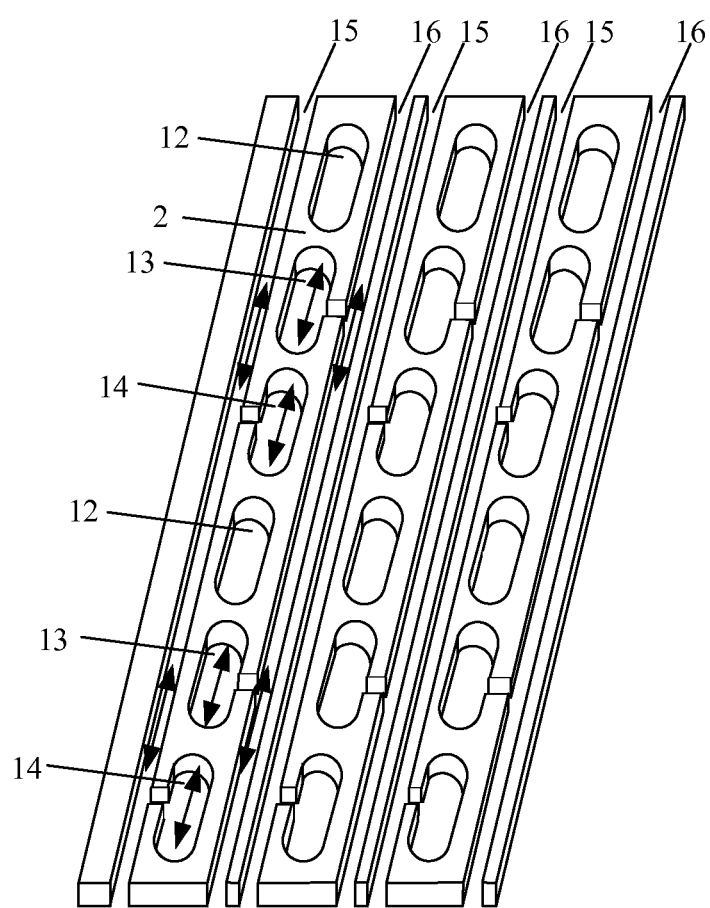
FIG. 10 is a schematic view showing the pixel defining layer according to the third embodiment of the present disclosure.

As shown in FIG. 10, which is another schematic view showing the pixel defining layer according to the third embodiment of the present disclosure, the pixel defining layer 2 is made of an insulating layer, e.g., polyimide. At Step 301, a polyimide layer having a thickness of 1 to 10 μm is formed on the substrate by a coating process, and then patterned so as to form the pixel aperture matrix and the connection channels 15, 16. The pixel aperture matrix includes the first pixel aperture 14 corresponding to the electroluminescent layer in the first color, the second pixel aperture 13 corresponding to the electroluminescent layer in the second color and the third pixel aperture 12 corresponding to the electroluminescent layer in the third color.

In FIG. 10, one column of pixel apertures corresponds to two longitudinally-arranged connection channels 15, 16, which are located at both sides of the corresponding column of the pixel apertures, respectively. The longitudinally-arranged connection channel 15 located at a left side of the corresponding column of the pixel apertures is connected to the first pixel apertures 14 in the corresponding column, the longitudinally-arranged connection channel 16 located at a right side of the corresponding column of the pixel apertures is connected to the second pixel apertures 13 in the corresponding column, and the third pixel apertures 12 in the corresponding column are not connected to the connection channels.

Step 302: subjecting the pixel defining layer and the connection channels to surface treatment, so as to enable an upper surface of the pixel defining layer to be lyophobic, and enable a bottom surface and/or an inner wall of the connection channel to be lyophilic. This step is similar to Step 202 in the second embodiment, and thus will not be particularly defined herein.

Step 303: forming the electroluminescent layer in the first color in the first pixel aperture by ink-jetting.

Alternatively, Step 303 includes the following steps.

Step 3031: dripping the solution of the electroluminescent material in the first color into the longitudinally-arranged connection channel connected to the first pixel aperture. At this step, a nozzle of the ink-jetting device is arranged above the longitudinally-arranged connection channel 15 connected to the first pixel aperture 14. During the dripping, the nozzle moves in the longitudinal direction (i.e., a direction indicated by an arrow in the connection channel 15 in FIG. 10), so as to evenly drip the solution of the electroluminescent material in the first color into the longitudinally-arranged connection channel 15, thereby to enable the solution of the electroluminescent material in the first color to flow into the first pixel apertures 14 in the corresponding row along the longitudinally-arranged connection channel 15. After the dripping is completed, the solution in all the first pixel apertures 14 in an identical column is at an identical liquid level, i.e., it is able to ensure that the solution in all the first pixel apertures 14 in an identical column is at an identical amount.

Step 3032: drying the solution of the electroluminescent material in the first color in the first pixel aperture, so as to form the electroluminescent layer in the first color. At this step, the solution of the electroluminescent material in the first color in the first pixel aperture 14 is dried to form the electroluminescent layer in the first color, and all the electroluminescent layers in an identical column are of an identical thickness.

It should be appreciated that, at Step 303, the solution of the electroluminescent material in the first color may also be dripped into the first pixel apertures 14 in a longitudinal direction, and through the connection channel 10, the solution in the first color in all the first pixel apertures 14 in an identical column is at an identical amount.

Step 304: forming the electroluminescent layer in the second color in the second pixel aperture by ink-jetting. This step is similar to Step 303. It should be appreciated that, Steps 303 and 304 may be performed simultaneously.

Step 305: forming the electroluminescent layer in the third color in the third pixel aperture by evaporation. This step is similar to Step 205 in the second embodiment, and thus will not be particularly defined herein. It should be appreciated that, an order of Steps 303, 304 and 305 is not particularly defined in this embodiment.

According to the method in the third embodiment of the present disclosure, the connection channel is formed on the pixel defining layer and configured to connect the pixel apertures in an identical column and corresponding to the electroluminescent layers in an identical color. When the solution of the electroluminescent material is dripped into the pixel aperture, the amounts of the solution of the electroluminescent material in the pixel apertures in an identical column and corresponding to the electroluminescent layers in an identical color are the same, and the electroluminescent layers formed after the drying are of an identical thickness. As a result, it is able to enable the electroluminescent device to emit light in an even manner, thereby to improve the performance of the electroluminescent device.

Fourth Embodiment

The present disclosure provides in this embodiment an electroluminescent device, which includes a substrate, and a pixel defining layer arranged on the substrate. A pixel aperture matrix is formed in the pixel defining layer, at least one connection channel is formed on the pixel defining layer, an electroluminescent layer in a predetermined color is formed in each pixel aperture of the pixel aperture matrix, and the connection channel is configured to connect at least two pixel apertures of the pixel aperture matrix in an identical row or column and corresponding to the electroluminescent layers in an identical color.

To be specific, the connection channel may be arranged horizontally or longitudinally, the horizontally-arranged connection channel is configured to connect all the pixel apertures of the pixel aperture matrix in an identical row and corresponding to the electroluminescent layers in an identical color, and the longitudinally-arranged connection channel is configured to connect all the pixel apertures of the pixel aperture matrix in an identical column and corresponding to the electroluminescent layers in an identical color.

In an alternative embodiment, all the connection channels are arranged horizontally on the pixel defining layer 2. TO be specific, as shown in FIG. 5a, when all the pixel apertures 4 in an identical row correspond to the electroluminescent layers in one color, the horizontally-arranged connection channel may be arranged at a side of the corresponding row of the pixel apertures 4. In addition, when all the pixel apertures 4 in an identical row correspond to the electroluminescent layers in two or more colors, two horizontally-arranged connection channels may be arranged at both sides of the corresponding row of the pixel apertures 4, respectively.

In one embodiment, as shown in FIG. 7, the pixel aperture matrix includes the first pixel aperture 14, the second pixel aperture 13 and the third pixel aperture 12, and the predetermined colors include a first color, a second color and a third color. The first pixel aperture 14 corresponds to the electroluminescent layer in the first color, the second pixel aperture 13 corresponds to the electroluminescent layer in the second color, and the third pixel aperture 12 corresponds to the electroluminescent layer in the third color. Each row of the pixel apertures in the pixel aperture matrix corresponds to two horizontally-arranged connection channels 10, 11. The horizontally-arranged connection channel 10 located at one side (an upper side) of the corresponding row of the pixel apertures is connected to the first pixel apertures 14 in the corresponding row, the horizontally-arranged connection channel 11 located at the other side (a lower side) of the corresponding row of the pixel apertures is connected to the second pixel apertures 13 in the corresponding row. Hence, during the formation of the electroluminescent layer in the first color and the electroluminescent layer in the second color in the first pixel aperture 14 and the second pixel aperture 13 by ink-jetting, due to the connection channel 10, it is able to ensure that the solution of the electroluminescent material in the first color in the first pixel apertures 14 in an identical row is at an identical amount, thereby to ensure that the electroluminescent layers in the first color formed after the drying have an identical thickness; and due to the connection channel 11, it is able to ensure that the solution of the electroluminescent material in the second color in the second pixel apertures 13 in an identical row is at an identical amount, thereby to ensure that the electroluminescent layers in the second color formed after the drying have an identical thickness.

In another alternative embodiment, all the connection channels are arranged longitudinally on the pixel defining layer. To be specific, as shown in FIG. 5b, when all the pixel apertures 4 in an identical column correspond to the electroluminescent layers in one color, the longitudinally-arranged connection channel may be formed at a side of the corresponding column of the pixel apertures. In addition, when all the pixel apertures 4 in an identical column correspond to the electroluminescent layers in two or more colors, two longitudinally-arranged connection channels may be formed at both sides of the corresponding column of the pixel apertures 4, respectively.

In another embodiment, as shown in FIG. 10, the pixel aperture matrix includes the first pixel aperture 14, the second pixel aperture 13 and the third pixel aperture 12, and the predetermined colors include a first color, a second color and a third color. The first pixel aperture 14 corresponds to the electroluminescent layer in the first color, the second pixel aperture 13 corresponds to the electroluminescent layer in the second color, and the third pixel aperture 12 corresponds to the electroluminescent layer in the third color. Each column of the pixel apertures in the pixel aperture matrix corresponds to two longitudinally-arranged connection channels 15, 16. The longitudinally-arranged connection channel 15 located at one side (a left side) of the corresponding column of the pixel apertures is connected to the first pixel apertures 14 in the corresponding column, the longitudinally-arranged connection channel 16 located at the other side (a right side) of the corresponding column of the pixel apertures is connected to the second pixel apertures 13 in the corresponding column. Hence, during the formation of the electroluminescent layer in the first color and the electroluminescent layer in the second color in the first pixel aperture 14 and the second pixel aperture 13 by ink-jetting, due to the connection channel 15, it is able to ensure that the solution of the electroluminescent material in the first color in the first pixel apertures 14 in an identical column is at an identical amount, thereby to ensure that the electroluminescent layers in the first color formed after the drying have an identical thickness; and due to the connection channel 16, it is able to ensure that the solution of the electroluminescent material in the second color in the second pixel apertures 13 in an identical column is at an identical amount, thereby to ensure that the electroluminescent layers in the second color formed after the drying have an identical thickness.

Of course, the arrangement modes of the connection channels are not limited to the above, and alternatively, the connection channels may be arranged horizontally and longitudinally on the pixel defining layer.

According to the electroluminescent device in the fourth embodiment of the present disclosure, the electroluminescent device includes the substrate and the pixel defining layer. the pixel aperture matrix is formed in the pixel defining layer, at least one connection channel is formed on the pixel defining layer, the electroluminescent layer in the predetermined color is formed in each pixel aperture of the pixel aperture matrix, and the connection channel is configured to connect at least two pixel apertures of the pixel aperture matrix in an identical row or column and corresponding to the electroluminescent layers in an identical color. The connection channel is formed on the pixel defining layer and configured to connect the pixel apertures in an identical row or column and corresponding to the electroluminescent layers in an identical color. When the solution of the electroluminescent material is dripped into the pixel aperture, the amounts of the solution of the electroluminescent material in the pixel apertures in an identical row or column and corresponding to the electroluminescent layers in an identical color are the same, and the electroluminescent layers formed after the drying are of an identical thickness. As a result, it is able to enable the electroluminescent device to emit light in an even manner, thereby to improve the performance of the electroluminescent device.

Fifth Embodiment

The present disclosure provides in this embodiment a display substrate including the electroluminescent device in the fourth embodiment. According to this embodiment, it is able for a light-emitting surface of the display substrate to generate light beams in an even manner, thereby to improve the display performance of the display substrate.

In addition, the present disclosure further provides in this embodiment a display device including the above-mentioned display substrate.

The above are merely the preferred embodiments of the present disclosure. It should be appreciated that, a person skilled in the art may make further modifications and improvements without departing from the spirit of the present disclosure, and these modifications and improvements shall also fall within the scope of the present disclosure.

What is claimed is:

1. An electroluminescent device, comprising a substrate, and a pixel defining layer arranged on the substrate, wherein a pixel aperture matrix is formed in the pixel defining layer, at least one connection channel is formed on the pixel defining layer, an electroluminescent layer in a predetermined color is formed in each pixel aperture of the pixel aperture matrix, and the connection channel is configured to connect at least two pixel apertures of the pixel aperture matrix in an identical row or column and corresponding to the electroluminescent layers in an identical color, wherein:
the connection channel is arranged horizontally or longitudinally, the horizontally-arranged connection channel is configured to connect all the pixel apertures of the pixel aperture matrix in an identical row and corresponding to the electroluminescent layers in an identical color, and the longitudinally-arranged connection channel is configured to connect all the pixel apertures of the pixel aperture matrix in an identical column and corresponding to the electroluminescent layers in an identical color,
all the connection channels on the pixel defining layer are arranged horizontally or longitudinally,
when all the connection channels are arranged horizontally, the pixel apertures in one row correspond to two horizontally-arranged connection channels which are arranged at both sides of the corresponding row of the pixel apertures, respectively; and
when all the connection channels are arranged longitudinally, the pixel apertures in one column correspond to two longitudinally-arranged connection channels which are arranged at both sides of the corresponding column of the pixel apertures, respectively.

2. The electroluminescent device according to claim 1, wherein the predetermined colors comprise a first color, a second color and a third color, and the pixel aperture matrix comprises a first pixel aperture corresponding to the electroluminescent layer in the first color, a second pixel aperture corresponding to the electroluminescent layer in the second color and a third pixel aperture corresponding to the electroluminescent layer in the third color;

when all the connection channels are arranged horizontally, the connection channel located at a first side of a row of the pixel apertures is connected to the first pixel apertures in a corresponding row, and the connection channel located at a second side of the row of the pixel apertures is connected to the second pixel apertures in a corresponding row; and
when all the connection channels are arranged longitudinally, the connection channel located at the first side of a column of the pixel apertures is connected to the first pixel apertures in a corresponding column, and the connection channel located at the second side of the column of the pixel apertures is connected to the second pixel apertures in a corresponding column.

3. A method for manufacturing an electroluminescent device, comprising steps of:

forming a pixel defining layer on a substrate, a pixel aperture matrix being formed in the pixel defining layer, at least one connection channel being formed on the pixel defining layer, the connection channel being configured to connect at least two pixel apertures of the pixel aperture matrix in an identical row or column and corresponding to electroluminescent layers in an identical color; and
forming the electroluminescent layers in a predetermined color in each pixel aperture of the pixel aperture matrix,
wherein:
the connection channel is arranged horizontally or longitudinally, the horizontally-arranged connection channel is configured to connect all the pixel apertures of the pixel aperture matrix in an identical row and corresponding to the electroluminescent layers in an identical color, and the longitudinally-arranged connection channel is configured to connect all the pixel apertures of the pixel aperture matrix in an identical column and corresponding to the electroluminescent layers in an identical color,
all the connection channels on the pixel defining layer are arranged horizontally or longitudinally,
when all the connection channels are arranged horizontally, the pixel apertures in one row correspond to two horizontally-arranged connection channels which are arranged at both sides of the corresponding row of the pixel apertures, respectively; and
when all the connection channels are arranged longitudinally, the pixel apertures in one column correspond to two longitudinally-arranged connection channels which are arranged at both sides of the corresponding column of the pixel apertures, respectively.

4. The method according to claim 3, wherein the step of forming the pixel defining layer on the substrate comprises:

forming a base material of the pixel defining layer on the substrate; and patterning the base material of the pixel defining layer so as to form the pixel aperture matrix and the connection channel.

5. The method according to claim 3, wherein the predetermined colors comprise a first color, a second color and a third color, and the pixel aperture matrix comprises a first pixel aperture corresponding to the electroluminescent layer in the first color, a second pixel aperture corresponding to the electroluminescent layer in the second color and a third pixel aperture corresponding to the electroluminescent layer in the third color;

when all the connection channels are arranged horizontally, the connection channel located at a first side of a row of the pixel apertures is connected to the first pixel apertures in the corresponding row, and the connection channel located at a second side of the row of the pixel apertures is connected to the second pixel apertures in the corresponding row; and when all the connection channels are arranged longitudinally, the connection channel located at the first side of a column of the pixel apertures is connected to the first pixel apertures in the corresponding column, and the connection channel located at the second side of the column of the pixel apertures is connected to the second pixel apertures in the corresponding column.

6. The method according to claim 5, wherein the step of forming the electroluminescent layer in a predetermined color in each pixel aperture of the pixel aperture matrix comprises:

forming the electroluminescent layer in the first color and the electroluminescent layer in the second color in the first pixel aperture and the second pixel aperture by ink-jetting, respectively; and forming the electroluminescent layer in the third color in the third pixel aperture by evaporation.

7. The method according to claim 6, wherein the step of forming the electroluminescent layer in the first color and the electroluminescent layer in the second color in the first pixel aperture and the second pixel aperture by ink-jetting, respectively, comprises:

dripping a solution of an electroluminescent material in the first color and a solution of an electroluminescent material in the second color into the first pixel aperture and the second pixel aperture in a longitudinal direction, respectively; and drying the solution of the electroluminescent material in the first color and the solution of the electroluminescent material in the second color, so as to form the electroluminescent layer in the first color and the electroluminescent layer in the second color, respectively.

8. The method according to claim 6, wherein when all the connection channels are arranged horizontally, the step of forming the electroluminescent layer in the first color and the electroluminescent layer in the second color in the first pixel aperture and the second pixel aperture by ink-jetting, respectively, comprises:

dripping a solution of an electroluminescent material in the first color and a solution of an electroluminescent material in the second color into the connection channel connected to the first pixel aperture and the connection channel connected to the second pixel aperture in a horizontal direction, respectively, the solution of the electroluminescent material in the first color flowing into the first pixel aperture along the connection channel, and the solution of the electroluminescent material in the second color flowing into the second pixel aperture along the connection channel; and drying the solution of the electroluminescent material in the first color and the solution of the electroluminescent material in the second color, so as to form the electroluminescent layer in the first color and the electroluminescent layer in the second color, respectively, and when all the connection channels are arranged longitudinally, the step of forming the electroluminescent layer in the first color and the electroluminescent layer in the second color in the first pixel aperture and the second pixel aperture by ink-jetting, respectively, comprises:

dripping a solution of an electroluminescent material in the first color and a solution of an electroluminescent material in the second color into the connection channel connected to the first pixel aperture and the connection channel connected to the second pixel aperture in a longitudinal direction, respectively, the solution of the electroluminescent material in the first color flowing into the first pixel aperture along the connection channel, and the solution of the electroluminescent material in the second color flowing into the second pixel aperture along the connection channel; and drying the solution of the electroluminescent material in the first color and the solution of the electroluminescent material in the second color, so as to form the electroluminescent layer in the first color and the electroluminescent layer in the second color, respectively.

9. The method according to claim 3, wherein prior to the step of forming the electroluminescent layer in the predetermined color in each pixel aperture of the pixel aperture matrix, the method further comprises:

subjecting the pixel defining layer and the connection channel to surface treatment, so as to enable an upper surface of the pixel defining layer to be lyophobic, and enable a bottom surface and/or an inner wall of the connection channel to be lyophilic.

10. The method according to claim 9, wherein the pixel defining layer is made of polyimide, and the step of subjecting the pixel defining layer and the connection channel to surface treatment comprises:

subjecting the upper surface of the pixel defining layer and the bottom surface and/or the inner wall of the connection channel to plasma treatment; and irradiating the bottom surface and/or the inner wall of the connection channel with ultraviolet light.

11. The method according to claim 10, wherein a reactive gas for the plasma treatment is fluoride.

12. A display device comprising the electroluminescent device according to claim 1.

* * * * *